(12) United States Patent
Jeong (10) Patent No.: US 10,062,447 B2
(45) Date of Patent: Aug. 28, 2018

(54) POWER SWITCH CIRCUIT

(71) Applicant: MagnaChip Semiconductor, Ltd., Cheongju-si (KR)

(72) Inventor: Duk Ju Jeong, Seoul (KR)

(73) Assignee: MagnaChip Semiconductor, Ltd. (KR)

( * ) Notice: Subject to any disclaimer, the term of this patent is extended or adjusted under 35 U.S.C. 154(b) by 0 days.

(21) Appl. No.: 15/482,018

(22) Filed: Apr. 7, 2017

(65) Prior Publication Data

US 2018/0033493 A1    Feb. 1, 2018

(30) Foreign Application Priority Data

Jul. 27, 2016 (KR) ........................ 10-2016-0095666

(51) Int. Cl.
*G11C 17/18* (2006.01)
*G11C 17/16* (2006.01)

(52) U.S. Cl.
CPC ............. *G11C 17/18* (2013.01); *G11C 17/16* (2013.01)

(58) Field of Classification Search
CPC .................................. G11C 8/08; G11C 17/18
See application file for complete search history.

(56) References Cited

U.S. PATENT DOCUMENTS

| 2008/0170433 A1* | 7/2008 | Yamada | G11C 8/08 365/185.03 |
| 2010/0202183 A1* | 8/2010 | Kurjanowicz | G11C 17/16 365/94 |
| 2010/0220511 A1* | 9/2010 | Kurjanowicz | G11C 17/16 365/96 |
| 2011/0199837 A1* | 8/2011 | Reohr | G11C 8/08 365/189.06 |
| 2013/0135941 A1* | 5/2013 | Reohr | G11C 11/406 365/189.02 |
| 2013/0301348 A1* | 11/2013 | Perroni | G11C 8/10 365/163 |
| 2014/0156924 A1* | 6/2014 | Jeon | G11O 5/147 711/108 |

* cited by examiner

*Primary Examiner* — Hoai V Ho
*Assistant Examiner* — Jay Radke
(74) *Attorney, Agent, or Firm* — McGuireWoods LLP (57) ABSTRACT

Provided is a power switch circuit that includes a first level shifter that, in response to execution of a programming operation of a one-time programmable (OTP) memory cell array, turns on a first switching device that has received a supply voltage from an external supply voltage pad. The power switch circuit also include a second level shifter that, in response to execution of the programming operation, turns on a second switching device connected to the first switching device, to provide the supply voltage to the OTP memory cell array. The power switch circuit further includes a third level shifter that, in response to execution of a read operation of the OTP memory cell array, turns on a third switching device to provide a power voltage, which is internally generated within the power switch circuit, to the OTP memory cell array.

22 Claims, 4 Drawing Sheets

POWER SWITCH CIRCUIT

CROSS REFERENCE TO PRIOR APPLICATIONS

This application claims priority to and the benefit thereof from Korean Patent Application No. 10-2016-0095666 filed on Jul. 27, 2016, titled "POWER SWITCH CIRCUIT," the entirety of which is hereby incorporated herein by reference.

FIELD OF THE INVENTION

The present invention relates to a power switch circuit, and, more particularly, to a power switch circuit that selectively provides one of a plurality of voltages to a one-time programmable (OTP) memory cell array.

BACKGROUND OF THE DISCLOSURE

A memory is a device for storing information (e.g., data), and there are various types of the memory. A semiconductor memory may be largely classified into a volatile memory and a non-volatile memory. The volatile memory retains data stored therein while powered on, but when the power is interrupted, the stored data is lost. In contrast, non-volatile memory maintains stored data even when power is off.

An OTP memory cell according to an existing technology is capable of generating a peak-to-peak voltage $V_{PP}$ and performing a programming operation. However, if a $V_{PP}$ voltage is designed to be generated within the OTP memory cell, it is not possible for the OTP memory cell to generate an accurate $V_{PP}$ voltage because of a process variation. In addition, the OTP memory cell may generate a band gap reference voltage, and may also generate a $V_{PP}$ voltage by boosting the generated band gap reference voltage. The band gap reference voltage generated by the OTP memory cell may vary, and thus, the OTP memory cell may not be capable of generating an accurate $V_{PP}$ voltage.

SUMMARY OF THE DISCLOSURE

According to an aspect of the disclosure, a power switch circuit includes a first level shifter that, in response to execution of a programming operation of an OTP (one-time programmable) memory cell array, turns on a first switching device that has received a supply voltage from an external supply voltage pad; a second level shifter that, in response to execution of the programming operation, turns on a second switching device connected to the first switching device, to provide the supply voltage to the OTP memory cell array; and a third level shifter that, in response to execution of a read operation of the OTP memory cell array, turns on a third switching device to provide a power voltage, which is internally generated within the power switch circuit, to the OTP memory cell array.

The second level shifter may turn off the second switching device when the supply voltage is discharged to a ground voltage.

The second level shifter may turn off the second switching device when the supply voltage pad is connected to the ground via the first switching device.

In a deep sleep mode that is operated at a low-power level, the second level shifter may block the supply voltage from being provided to the OTP memory cell array. The second level shifter may receive a deep sleep mode input signal in the deep sleep mode to output a rated voltage.

The second level shifter may block the supply voltage, which may be provided to the OTP memory cell array, based on the deep sleep mode input signal so as to maintain a floating status of the supply voltage pad or to connect the supply voltage pad to a ground voltage or the rated voltage.

In response to execution of the read operation, the first and second level shifters may turn off the first and second switching devices, respectively, to block the supply voltage.

In response to execution of the programming operation, the third level shifter may turn off the third switching device to block the power voltage.

The first, second, and third level shifters may open or close the first, second, and third switching devices, respectively, based on a write enable signal and a write enable bar signal.

Each of the first, second, and third switching devices may include a PMOS.

According to another aspect of the disclosure, a power switch circuit includes a first level shifter that opens or closes a first switching device that has received a supply voltage from an external supply voltage pad; a second level shifter that opens or closes a second switching device connected to the first switching device and an OTP memory cell array, to determine whether to provide the supply voltage to the OTP memory cell array; and a third level shifter that opens or closes a third switching device connected to the OTP memory cell array, to determine whether to provide a power voltage to the OTP memory cell array.

In response to execution of a programming operation of the OTP memory cell array, the first and second level shifters may turn on the first and second switching devices, respectively, to provide the supply voltage to the OTP memory cell array.

In response to execution of a read operation of the OTP memory cell array, the third level shifter may turn on the third switching device to provide the power voltage to the OTP memory cell array.

The second level shifter may turn off the second switching device when the supply voltage pad is connected to a ground via the first switching device.

According to yet another aspect of the disclosure, a power switching circuit includes a memory cell array; a first switch connected to a first voltage source providing a first voltage; a second switch coupled between the first switch and the memory cell; a third switch coupled between the memory cell and a second voltage source providing a second voltage; and a controller that selectively operates the first, second and third switches based on an operation of the memory cell array to provide one of the first voltage and the second voltage to the memory cell array.

The first voltage source may include an external voltage source, and the second voltage source may comprise an internal voltage source.

The controller may control the first, second and third switches to provide the first voltage to the memory cell array when the memory cell array carries out a programming operation, and to provide the second voltage to the memory cell array when the memory cell array carries out a read operation, wherein the first voltage is greater than the second voltage.

The controller may close the first switch and the second switch when the memory cell array carries out the read operation, and the controller may close the third switch when the memory cell array carries out the programming operation.

The controller may close the second switch when the first voltage is discharged or when the memory cell array is in a deep sleep mode.

The controller may comprise a first level shifter connected to the first switch; a second level shifter connected to the second switch; and a third level shifter connected to the third switch. The first, second and third level shifters may control the first, second and third switches, respectively, based on a write enable signal and a write enable bar signal.

Additional features, advantages, and embodiments of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

Figure 1:
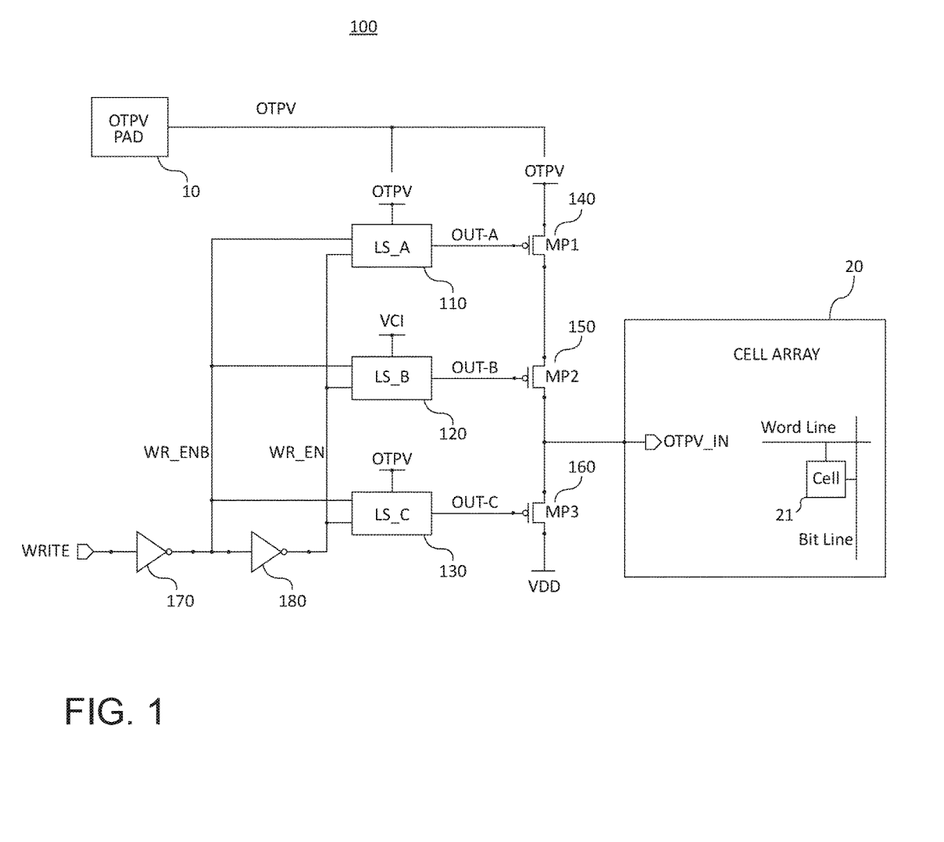
FIG. 1 is a block diagram illustrating an example of a power switch circuit, constructed according to the principles of the disclosure.

FIG. 1 is a block diagram illustrating an example of a power switch circuit 100, constructed according to the principles of the disclosure.

Referring to FIG. 1, the power switch circuit 100 may include a first level shifter 110, a second level shifter 120, a third level shifter 130, a first switching device 140, a second switching device 150, a third switching device 160, a first inverter 170, a second inverter 180, and/or the like.

The power switch circuit 100 may receive a supply voltage OTPV from an external supply voltage source, such as, for example, an external supply voltage pad (OTPV PAD) 10, and may provide the supply voltage OTPV to a one-time programmable (OTP) memory cell array 20. More specifically, the power switch circuit 100 may select one of the supply voltage OTPV received from the external supply voltage pad and a power voltage VDD generated internally within the power switch circuit 100, and the like, and may provide the selected voltage to the OTP memory cell array 20. The power switch circuit 100 may select one of the supply voltage OTPV and the power voltage VDD, using, for example, the first, second, and third switching devices 140, 150, or 160 that may be selectively opened or closed based on a write enable signal WR_EN and a write enable bar signal WR_ENB.

The power switch circuit 100 may provide the supply voltage OTPV to the OTP memory cell array 20 in response to execution of a programming operation of the OTP memory cell array 20, and may provide the power voltage VDD to the OTP memory cell array 20 in response to a read operation of the OTP memory cell array 20. Since the power switch circuit 100 receives the supply voltage OTPV from the external supply voltage pad 10 and provides the supply voltage OTPV to the OTP memory cell array 20, the power switch circuit 100 may be enabled to provide the supply voltage OTPV to the OTP memory cell array 20, regardless of a process variation. In addition, since the power switch circuit 100 receives the supply voltage OTPV from the external supply voltage pad 10, a charge pump circuit may not be necessary, and it may also be possible to reduce the layout size of the power switch circuit 100.

The external supply voltage pad 10 may be disposed adjacent to a ground pad (not shown) or a rated voltage pad (not shown). The supply voltage pad 10 may be bonded to the ground pad or the rated voltage pad to thereby prevent static electricity that could occur in a floating status. The OTP memory cell array 20 may perform a programming operation or a read operation by receiving the supply voltage OTPV or the power voltage VDD.

The first level shifter 110 may open or close the first switching device 140 that may receive the supply voltage OTPV from the external supply voltage pad 10. More specifically, the first level shifter 110 may receive the write enable bar signal WR_ENB and the write enable signal WR_EN from the first and second inverters 170 and 180, respectively, shift into the supply voltage OTPV, and provide the supply voltage OTPV to the first switching device 140. That is, the first level shifter 110 may open or close the first switching device 140 based on the write enable bar signal WR_ENB and the write enable signal WR_EN.

In one embodiment, in response to execution of a programming operation of the OTP memory cell array 20, the first level shifter 110 may turn on the first switching device 140 that has received the supply voltage OTPV from the external supply voltage pad 10. In response to execution of a read operation of the OTP memory cell array 20, the first level shifter 110 may turn off the first switching device 140.

The second level shifter 120 may open or close the second switching device 150, which may be coupled between the first switching device 140 and the OTP memory cell array 20, to determine whether or not to provide the supply voltage OTPV to the OTP memory cell array 20. More specifically, the second level shifter 120 may receive the write enable bar signal WR_ENB and the write enable signal WR_EN from the first and second inverters 170 and 180, respectively, shift into a rated voltage VCI, and provide the rated voltage VCI to the second switching device 150. The rated voltage VCI may correspond to a voltage used in the power switch circuit 100. That is, the second level shifter 120 may open or close the second switching device 150 based on the write enable bar signal WR_ENB and the write enable signal WR_EN.

In one embodiment, in response to execution of a programming operation of the OTP memory cell array 20, the second level shifter 120 may turn on the second switching device 150, which is connected to the first switching device 140, to provide the supply voltage OTPV to the OTP memory cell array 20. On the other hand, in response to execution of a read operation of the OTP memory cell array 20, the second level shifter 120 may turn off the second switching device 150 to block the supply voltage OTPV from being provided to the OTP memory cell array 20. That is, in response to execution of a read operation of the OTP memory cell array 20, the first and second level shifters 110 and 120 may turn off the first and second switching devices 140 and 150, respectively, to block the supply voltage OTPV.

When the supply voltage OTPV is discharged to a ground voltage VSS, the second level shifter 120 may turn off the second switching device 150. When the supply voltage pad 10 is connected to the ground via the first switching device 140, the second level shifter 120 may turn off the second switching device 150 to prevent a cell array input voltage OTPV_IN from being connected to the ground voltage VSS via the second switching device 150. The supply voltage OTPV may be discharged to the ground voltage VSS when a programming operation of the OTP memory cell array 20 is completed. In one embodiment, upon completion of the programming operation of the OTP memory cell array 20, the power switch circuit 100 may receive a write signal WRITE at a low level (or 0). If the write signal WRITE corresponds to the low level (or 0), the second level shifter 120 may receive the write enable bar signal WR_ENB at a high level (or 1) and the write enable signal WR_EN at the low level (or 0). The second level shifter 120 may receive the write enable bar signal WR_ENB at the high level (or 1) and the write enable signal WR_EN at the low level (or 0), and output the rated voltage VCI by performing a level-shifting procedure.

The rated voltage VCI may be a voltage used to drive the power switch circuit 100, and, once power is applied to the power switch circuit 100, the rated voltage VCI may be maintained at a constant value. That is, if the power switch circuit 100 receives the write signal WRITE at the low level (or 0), an output OUT_B of the second level shifter 120 may be maintained at the rated voltage VCI and the second switching device 150 may remain turned-off. As a result, when the supply voltage OTPV is discharged to the ground voltage VSS, the second level shifter 120 may turn off the second switching device 150 to block a leakage path. Also, when a write operation or a read operation is performed, the second level shifter 120 may provide the supply voltage OTPV or the power voltage VDD to the OTP memory cell array 20 in a stable manner.

The third level shifter 130 may open or close the third switching device 160, which may be connected to the OTP memory cell array 20, to determine whether or not to provide the power voltage VDD to the OTP memory cell array 20. More specifically, the third level shifter 130 may receive the write enable bar signal WR_ENB and the write enable signal WR_EN from the first and second inverters 170 and 180, respectively, shift into the supply voltage OTPV, and provide the supply voltage OTPV to the third switching device 160. The third level shifter 130 may open or close the third switching device 160 based on the write enable bar signal WR_ENB and the write enable signal WR_EN.

In one embodiment, in response to execution of a read operation of the OTP memory cell array 20, the third level shifter 130 may turn on the third switching device 160 to provide the power voltage VDD to the OTP memory cell array 20. In response to execution of a programming operation of the OTP memory cell array 20, the third level shifter 130 may turn off the third switching device 160 to block the power voltage VDD.

In one embodiment, the first, second, and third level shifters 110, 120, and 130 may select the supply voltage OTPV or the power voltage VDD and then turns on the first and the second switching devices 140 and 150 or the third switching device 160.

In one embodiment, each of the first, second, and third switching devices 140, 150, and 160 may be implemented as a PMOS to prevent a drop of the supply voltage OTPV or the power voltage VDD. Each of the first, second, and third switching devices 140, 150, and 160 may be turned off in response to a high level (or 1) received at a gate thereof, and may be turned on in response to a low level (or 0) being received at the gate. The power switch circuit 100 may be able to provide the supply voltage OTPV or the power voltage VDD at a constant level to the OTP memory cell array 20 via the first, second, and third switching devices 140, 150, and 160.

The first and second inverters 170 and 180 may be connected in series, so that an output from the first inverter 170 may be applied as an input to the second inverter 180. That is, the outputs from the first and second inverters 170 and 180 may be always different from each other. In one embodiment, the power switch circuit 100 may receive the write signal WRITE, and generate the write enable bar signal WR_ENB and the write enable signal WR_EN through the first and second inverters 170 and 180.

For example, in response to execution of a programming operation of the OTP memory cell array 20, the power switch circuit 100 may receive the write signal WRITE at a high level (or 1). If the power switch circuit 100 receives the write signal WRITE at the high level (or 1), the write enable bar signal WR_ENB may correspond to a low level (or 0) and the write enable signal WR_EN may correspond to a high level (or 1). If the write enable bar signal WR_ENB corresponds to the low level (or 0) and the write enable signal WR_EN corresponds to the high level (or 1), the first and second level shifters 110 and 120 may output a low level (or 0) to turn on the first and second switching devices 140 and 150, respectively, and the third level shifter 130 may output a high level (or 1) to turn off the third switching device 160. That is, when a programming operation of the OTP memory cell array 20 is performed, the first and second level shifters 110 and 120 may turn on the first and second switching devices 140 and 150, respectively, to provide the supply voltage OTPV to the OTP memory cell array 20.

In another example, when a read operation of the OTP memory cell array 20 is performed, the power switch circuit 100 may receive the write signal WRITE at a low level (or 0). If the power switch circuit 100 receives the write signal WRITE at the low level (or 0), the write enable bar signal WR_ENB may correspond to a high level (or 1) and the write enable signal WR_EN may correspond to a low level (or 0). If the write enable bar signal WR_ENB corresponds to the high level (or 1) and the write enable signal WR_EN corresponds to the low level (or 0), the first and second level shifters 110 and 120 may output a high level (or 1) to turn off the first and second switching devices 140 and 150, respectively, and the third level shifter 130 may output a low level (or 0) to turn on the third switching device 160. That is, when a read operation of the OTP memory cell array 20 is performed, the third level shifter 130 may turn on the third switching device 160 to provide the power voltage VDD to the OTP memory cell array 20.

Figure 2:
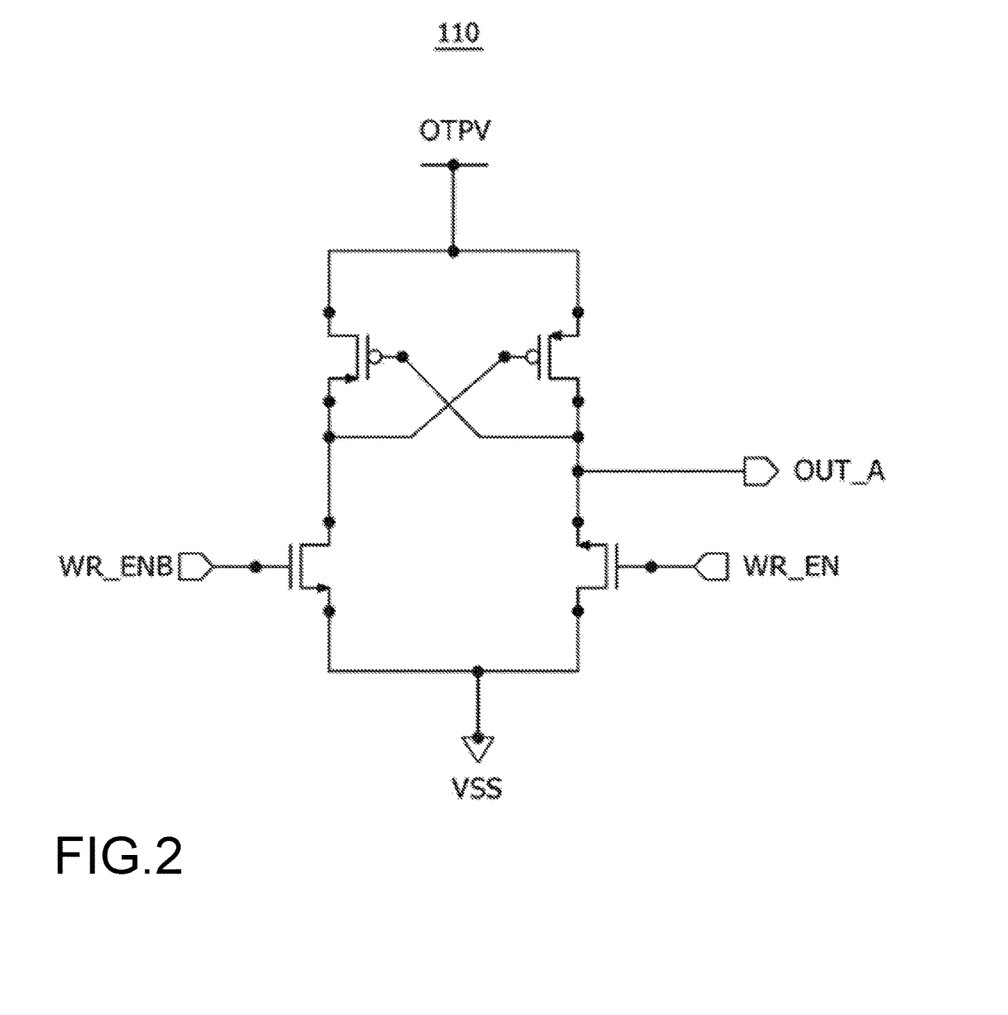
FIG. 2 is a circuit diagram illustrating an example of a first level shifter of the power switch circuit shown in FIG. 1, constructed according to the principles of the disclosure.

FIG. 2 is a circuit diagram illustrating an example of the first level shifter 110 of the power switch circuit shown in FIG. 1, constructed according to the principles of the disclosure.

Referring to FIG. 2, the first level shifter 110 may open or close the first switching device 140 based on the write enable signal WR_EN and the write enable bar signal WR_ENB. In one embodiment, the first level shifter 110 may be implemented as a current mirror. That is, the level shifter 110 may be configured such that two PMOS devices and two NMOS devices are arranged in a symmetric structure, and one end of the current mirror may correspond to an output stage OUT_A of the first level shifter 110. The output OUT_A of the first level shifter 110 may be applied to a gate of the first switching device 140.

Figure 3:
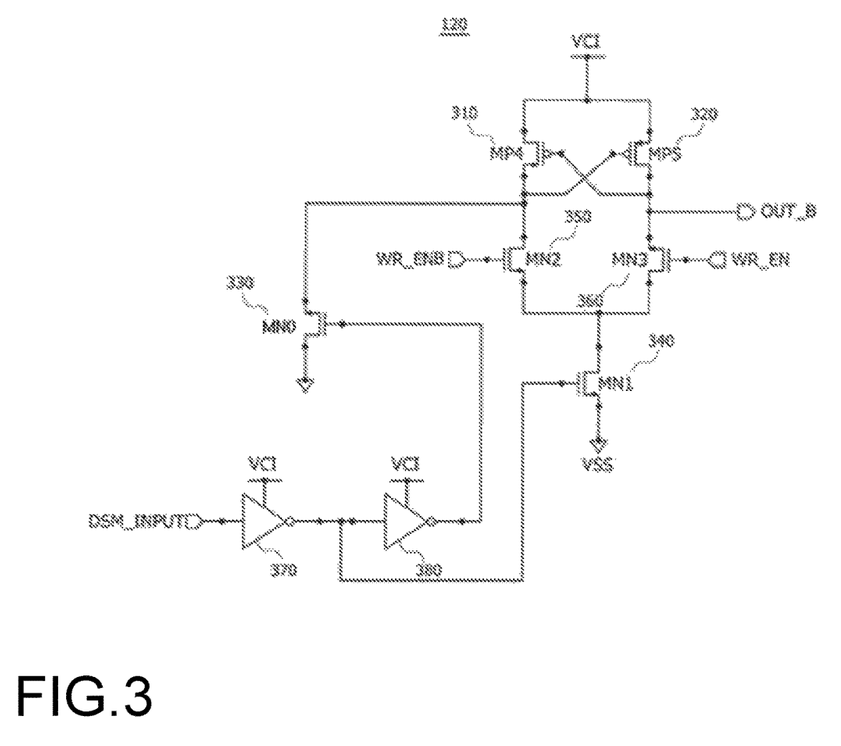
FIG. 3 is a circuit diagram illustrating an example of a second level shifter of the power switch circuit shown in FIG. 1, constructed according to the principles of the disclosure.

FIG. 3 is a circuit diagram illustrating an example of the second level shifter of the power switch circuit shown in FIG. 1, constructed according to the principles of the disclosure.

Referring to FIG. 3, the second level shifter 120 may include, for example, a fourth switching device 310, a fifth switching device 320, a first NMOS 330, a second NMOS 340, a third NMOS 350, a fourth NMOS 360, a third inverter 370, and a fourth inverter 380. In one embodiment, the second level shifter 120 may be implemented as a current mirror. More specifically, the fourth switching device 310 and the third NMOS 350 may be symmetric with respect to the fifth switching device 320 and the fourth NMOS 360. The third NMOS 350 may receive the write enable bar signal WR_ENB, and the fourth NMOS 360 may receive the write enable signal WR_EN. The output stage OUT_B of the second level shifter 120 may correspond to a common terminal between a drain of the fifth switching device 320 and a drain of the fourth NMOS 360.

The third and fourth inverters 370 and 380 may be connected in series, so that an output from the third inverter 370 may be applied as an input to the fourth inverter 380. That is, the outputs from the third and fourth inverters 370 and 380 may be always different from each other. In one embodiment, the second level shifter 120 may receive a deep sleep mode input signal DSM_INPUT, and output a high level (or 1) or a low level (or 0) through the third and fourth inverters 370 and 380. An output of the third inverter 370 may be applied to a gate of the second NMOS 340, and an output of the fourth inverter 380 may be applied to a gate of the first NMOS 330.

In one embodiment, in a deep sleep mode, which is operated at a low-power level, the second level shifter 120 may block provision of the supply voltage OTPV to the OTP memory cell array 20. More specifically, in the deep sleep mode, the second level shifter 120 may output the rated voltage VCI by receiving a deep sleep mode input signal DSM_INPUT. The second level shifter 120 may block the supply voltage OTPV, which is being provided to the OTP memory cell array 20, based on the deep sleep mode input signal DSM_INPUT, so as to maintain a floating status of the supply voltage pad 10, or to connect the supply voltage pad 10 to the ground voltage VSS or the rated voltage VCI.

For example, when the power switch circuit 100 is in the deep sleep mode, the second level shifter 120 may receive the deep sleep mode input signal DSM_INPUT at a high level (or 1). When the second level shifter 120 receives the deep sleep mode input signal DSM_INPUT at the high level (or 1), a gate of the first NMOS 330 may receive a high level (or 1) and a gate of the second NMOS 340 may receive a low level (or 0). When the fifth switching device 320 and the first NMOS 330 are turned on and the second NMOS 340 is turned off, the output OUT_B of the second level shifter 120 may be maintained at the rated voltage VCI. Therefore, in the deep sleep mode, which is driven at a low-power level, the second level shifter 120 may turn off the second switching device 150 by outputting the rated voltage VCI, and may block the supply voltage OTPV from being provided to the OTP memory cell array 20.

Figure 4:
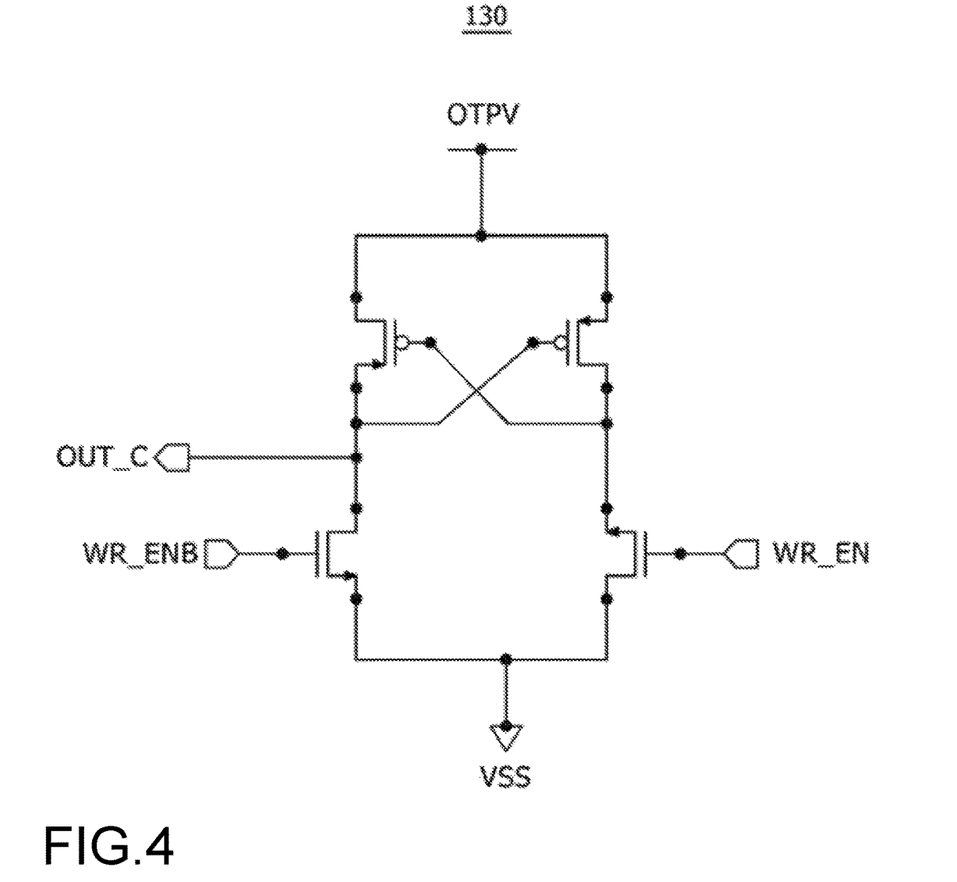
FIG. 4 is a circuit diagram illustrating of an example of a third level shifter of the power switch circuit shown in FIG. 1, constructed according to the principles of the disclosure.

FIG. 4 is a circuit diagram illustrating an example of a third level shifter of the power switch circuit shown in FIG. 1, constructed according to the principles of the disclosure.

Referring to FIG. 4, the third level shifter 130 may open or close the third switching device 160 based on the write enable signal WR_EN and the write enable bar signal WR_ENB. In one embodiment, the third level shifter 130 may be implemented as a current mirror. Similar to the first level shifter 110 shown in FIG. 2, the third level shifter 130 may be configured with two PMOS devices and two NMOS devices arranged in a symmetric structure, but an output stage of the third level shifter 130 may be placed at a location different from the location of the output stage of the first level shifter 110. For example, as shown in FIG. 2, the output stage OUT_A of the first level shifter 110 may be connected to a drain of the NMOS that receives the write enable signal WR_EN. An output terminal OUT_C of the third level shifter 130 may be connected to a drain of an NMOS that receives the write enable bar signal WR_ENB, as shown in FIG. 4. Even in a case where the first and third level shifters 110 and 130 receive the same write enable signal WR_EN and the same write enable bar signal WR_ENB, the first and third level shifters 110 and 130 may output different voltage levels. When a programming operation of the OTP memory cell array 20 is performed, the first and third level shifters 110 and 130 receive the same write enable signal WR_EN and the same write enable bar signal WR_ENB. In this case, the first level shifter 110 may be turned on and the third level shifter 130 may be turned off. Meanwhile, when a read operation of the OTP memory cell array 20 is performed, the first and third level shifters 110 and 130 may receive the same write enable signal WR_EN and the same write enable bar signal WR_ENB. In this case, the first level shifter 110 may turn off the first switching device 140 and the third level shifter 130 may turn on the third switching device 160. The output terminal OUT_C of the third level shifter 130 may be applied to a gate of the third switching device 160.

Therefore, referring to FIG. 1, the power switch circuit 100 may select either the supply voltage OTPV received from the external supply voltage pad 10 or the power voltage VDD generated inside the power switch circuit 100, and provide the selected voltage to the OTP memory cell array 20. When a programming operation or a read operation of the OTP memory cell array 20 is performed, the power switch circuit 100 may open or close the first, second, and third switches 140, 150, and 160 to select either the supply voltage OTPV or the power voltage VDD, and may provide the selected voltage to the OTP memory cell array 20. When the OTP memory cell array 20 is in the deep sleep mode, the power switch circuit 100 may turn off the second switching device 150 to block a leakage path of the supply voltage OTPV, and the second level shifter 120 may outputs the rated voltage VCI. In addition, when the OTP memory cell array 20 is in the deep sleep mode, the power switch circuit 100 may block a supply voltage, which is being provided to the OTP memory cell array 20, so as to maintain a floating status of the external supply voltage pad 10 or to connect the supply voltage pad 10 to the ground voltage VSS or the rated voltage VCI.

The terms "including," "comprising" and variations thereof, as used in this disclosure, mean "including, but not limited to," unless expressly specified otherwise.

The terms "a," "an," and "the," as used in this disclosure, means "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, or the like, may be described in a sequential order, such processes and methods may be configured to work in alternate orders. In other words, any sequence or order of steps that may be described does not necessarily indicate a requirement that the steps be performed in that order. The steps of the processes or methods described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

While the disclosure has been described in terms of exemplary embodiments, those skilled in the art will recognize that the disclosure can be practiced with modifications in the spirit and scope of the appended claim, drawings and attachment. The examples provided herein are merely illustrative and are not meant to be an exhaustive list of all possible designs, embodiments, applications or modifications of the disclosure.

What is claimed is:

1. A power switch circuit, comprising:
   a first level shifter that, in response to execution of a programming operation of a one-time programmable (OTP) memory cell array, turns on a first switching device that has received a supply voltage from an external supply voltage pad;
   a second level shifter that, in response to execution of the programming operation, turns on a second switching device connected to the first switching device, to provide the supply voltage to the OTP memory cell array, wherein the second level shifter receives a deep sleep mode input signal in the deep sleep mode to output a constant rated voltage; and
   a third level shifter that, in response to execution of a read operation of the OTP memory cell array, turns on a third switching device to provide a power voltage, which is internally generated within the power switch circuit, to the OTP memory cell array.

2. The power switch circuit of claim 1, wherein the second level shifter turns off the second switching device when the external voltage pad is discharged to a ground voltage.

3. The power switch circuit of claim 1, wherein the second level shifter turns off the second switching device when the supply voltage pad is connected to the ground via the first switching device.

4. The power switch circuit of claim 1, wherein, in the deep sleep mode that is operated at a low-power level, the second level shifter blocks the supply voltage from being provided to the OTP memory cell array.

5. The power switch circuit of claim 1, wherein the second level shifter blocks the supply voltage, which is being provided to the OTP memory cell array, based on the deep sleep mode input signal so as to maintain a floating status of the external voltage pad or to connect the external voltage pad to a ground voltage or the rated voltage.

6. The power switch circuit of claim 1, wherein, in response to execution of the read operation, the first and second level shifters turn off the first and second switching devices, respectively, to block the supply voltage.

7. The power switch circuit of claim 1, wherein, in response to execution of the programming operation, the third level shifter turns off the third switching device to block the power voltage.

8. The power switch circuit of claim 1, wherein the first, second, and third level shifters open or close the first, second, and third switching devices, respectively, based on a write enable signal and a write enable bar signal.

9. The power switch circuit of claim 1, wherein the first, second, or third switching device comprises a PMOS device.

10. A power switch circuit of claim 1, wherein a total number of level shifters in the power switch circuit does not exceed three.

11. A power switch circuit, comprising:
    a first level shifter that opens or closes a first switching device that has received a supply voltage from an external supply voltage source;
    a second level shifter that opens or closes a second switching device connected to the first switching device and a one-time programmable (OTP) memory cell array, to determine whether to provide the supply voltage to the OTP memory cell array, and the second level shifter configured to receive a deep sleep mode input signal in a deep sleep mode to output a rated voltage; and
    a third level shifter that opens or closes a third switching device connected to the OTP memory cell array, to determine whether to provide a power voltage to the OTP memory cell array.

12. The power switch circuit of claim 11, wherein, in response to execution of a programming operation of the OTP memory cell array, the first and second level shifters turn on the first and second switching devices, respectively, to provide the supply voltage to the OTP memory cell array.

13. The power switch circuit of claim 11, wherein, in response to execution of a read operation of the OTP memory cell array, the third level shifter turns on the third switching device to provide the power voltage to the OTP memory cell array.

14. The power switch circuit of claim 11, wherein the second level shifter turns off the second switching device when an external pad node for receiving the supply voltage source is connected to a ground via the first switching device.

15. A power switch circuit of claim 11, wherein a total number of level shifters in the power switch circuit does not exceed three.

16. A power switching circuit, comprising:
a memory cell array;
a first switch connected to a first voltage source providing a first voltage;
a second switch coupled between the first switch and the memory cell array, the second switch configured to output a constant rated voltage in a deep sleep mode;
a third switch coupled between the memory cell array and a second voltage source providing a second voltage; and
a controller that selectively operates the first, second and third switches based on an operation of the memory cell array to provide one of the first voltage and the second voltage to the memory cell array.

17. The power switching circuit of claim 16, wherein the first voltage source comprises an external voltage source and the second voltage source comprises an internal voltage source.

18. The power switching circuit of claim 16, wherein the controller controls the first, second and third switches to:
provide the first voltage to the memory cell array when the memory cell array carries out a programming operation, and
provide the second voltage to the memory cell array when the memory cell array carries out a read operation,
wherein the first voltage is greater than the second voltage.

19. The power switching circuit of claim 16, wherein the controller closes the first switch and the second switch when the memory cell array carries out the read operation, and
wherein the controller closes the third switch when the memory cell array carries out the programming operation.

20. The power switching circuit of claim 16, wherein the controller closes the second switch when the first voltage is discharged or when the memory cell array is in the deep sleep mode.

21. The power switching circuit of claim 16, wherein the controller comprises:
a first level shifter connected to the first switch;
a second level shifter connected to the second switch; and
a third level shifter connected to the third switch,
wherein the first, second and third level shifters control the first, second and third switches, respectively, based on a write enable signal and a write enable bar signal.

22. The power switching circuit of claim 21, wherein a total number of level shifters in the power switching circuit does not exceed three.

* * * * *